United States Patent
Cui et al.

(10) Patent No.: US 11,796,693 B2
(45) Date of Patent: Oct. 24, 2023

(54) ENERGY-RESOLVED X-RAY IMAGING APPARATUS AND METHOD

(71) Applicant: THE UNIVERSITY OF HONG KONG, Hong Kong (HK)

(72) Inventors: Xiaodong Cui, Hong Kong (HK); Chunlei Yang, Hong Kong (HK)

(73) Assignee: THE UNIVERSITY OF HONG KONG, Hong Kong (HK)

(*) Notice: Subject to any disclaimer, the term of this patent is extended or adjusted under 35 U.S.C. 154(b) by 146 days.

(21) Appl. No.: 17/426,657

(22) PCT Filed: Jan. 22, 2020

(86) PCT No.: PCT/CN2020/073748
§ 371 (c)(1),
(2) Date: Jul. 29, 2021

(87) PCT Pub. No.: WO2020/156416
PCT Pub. Date: Aug. 6, 2020

(65) Prior Publication Data
US 2022/0107432 A1 Apr. 7, 2022

Related U.S. Application Data

(60) Provisional application No. 62/799,023, filed on Jan. 30, 2019.

(51) Int. Cl.
G01T 1/29 (2006.01)
G01T 1/24 (2006.01)
H01L 31/119 (2006.01)

(52) U.S. Cl.
CPC ............ G01T 1/2928 (2013.01); G01T 1/243 (2013.01); H01L 31/119 (2013.01)

(58) Field of Classification Search
CPC ...... G01T 1/2928; G01T 1/243; H01L 31/119
See application file for complete search history.

(56) References Cited

U.S. PATENT DOCUMENTS 5,091,650 A 2/1992 Uchida et al.
7,381,956 B2 6/2008 Overdick et al.
(Continued)

FOREIGN PATENT DOCUMENTS

CN 1777821 5/2006
CN 101796429 8/2010
(Continued)

OTHER PUBLICATIONS

International Search Report and Written Opinion for International Application No. PCT/CN2020/073748 dated Apr. 27, 2020, 7 pages.
(Continued)

*Primary Examiner* — Hugh Maupin
(74) *Attorney, Agent, or Firm* — AMIN, TUROCY & WATSON LLP

(57) ABSTRACT

The invention relates to energy-resolved X-ray imaging apparatus and method. The present disclosure provides an apparatus for electromagnetic irradiation imaging. The apparatus includes one or more pixels, each pixel including a plurality of detector cells arranged in a row extending in a row direction. The row is configured to receive photons at an incident surface at one end of the row, and the received photons penetrate the plurality of detector cells in the row direction. The plurality of detector cells of the same row are configured to generate respective signals that collectively indicate an energy-resolved spectral profile of the photons based on the penetration of the photons into the row of detector cells.

20 Claims, 7 Drawing Sheets

(56) References Cited

U.S. PATENT DOCUMENTS

| | | |
|---|---|---|
| 7,932,497 B2 | 4/2011 | Laurence et al. |
| 8,513,613 B2 | 8/2013 | Herrmann et al. |
| 2004/0113085 A1* | 6/2004 | Heismann ............. G01T 1/2018 250/370.11 |
| 2007/0003006 A1 | 1/2007 | Tkaczyk et al. |
| 2017/0120076 A1* | 5/2017 | Allinson .............. A61B 6/4064 |
| 2018/0177481 A1 | 6/2018 | Jacob et al. |

FOREIGN PATENT DOCUMENTS

| | | |
|---|---|---|
| FR | 2705791 | 12/1994 |
| WO | 2018/118526 | 6/2018 |

OTHER PUBLICATIONS

Extended European Search Report for European Patent Application No. 20748103.7 dated Sep. 8, 2022.
Chinese Office Action and Search Report for Chinese Patent Application No. 202080010942.1 dated Apr. 27, 2023.

* cited by examiner

ENERGY-RESOLVED X-RAY IMAGING APPARATUS AND METHOD

TECHNICAL FIELD

The technology discussed below generally relates to energy-resolved X-ray imaging and specifically relates to a structure of an image sensor for providing energy-resolved X-ray imaging.

INTRODUCTION

X-ray technology has widespread applications in fundamental sciences (e.g., materials science, molecular biology, etc.), security inspection, medical diagnostic imaging, etc. X-ray generally refers to a family of electromagnetic wave with photon energies from $10^2$ electronvolts (eV) to $10^6$ eV, corresponding to $10^0$ to $10^{-3}$ nm in wavelength. Because the energy of X-ray photons is orders of magnitude higher than that of the outer-shell electrons, X-ray photons experience smaller light-matter scattering cross section and consequently exhibit a larger penetration depth, as compared with infrared and visible lights. Therefore, X-ray is useful in non-destructive structure/materials analysis and medical imaging. X-ray detectors can be used to convert high energy X-ray photons to electric signals. X-ray detectors are generally classified to two families: indirect-conversion detectors and direct-conversion detectors.

An indirect-conversion detector utilizes scintillators to convert high-energy X-ray photons to ensembles of low-energy visible photons, and then couple the visible photons with light detectors such as photomultipliers or CCD/CMOS/photodiodes to electric signals. With the advance of scintillators (e.g., CsI:TI, Gd2O2S:Eu, etc.) and light-coupling techniques, indirect-conversion X-ray detectors can be fairly efficient and cost-effective. Combined with thin film field effect transistor (TFT) techniques, large-area imaging with flat panel indirect-conversion detectors is commonly used in X-ray imaging in medical diagnostics. However, indirect-conversion detectors have slow time response and low spatial resolution, and do not have energy resolving power.

A direct-conversion detector detects the electric charges generated by X-ray photons in semiconductors, by a sequence of processes including photoelectric absorption and Compton scattering. In photoelectric absorption, incident X-ray photons kick out an inner shell electron with a total energy transfer. Neglecting the escape of characteristic X-rays from the detector volume (also known as fluorescent lines), the photoelectric effect results in the total absorption of the incident photon energy. The photoelectric effect dominates in the energy region up to 200 keV. While in Compton scattering, an incident photon scattered by outer electrons with fractional energy transfer, produces a hot electron or electron-hole pairs and a lower energy photon. This scattering induces an electric field in the semiconductors and produces electric signals. To realize a direct-conversion detector with a fast time response, the detector needs to have a compact size, high charge mobility, and small parasite capacitance. A direct-conversion detector can convert the electric signals to voltage pulses. A technique similar to photon-counting in photonics may be used to monitor the X-ray photon energy by the pulse profile. When an X-ray photon releases energy E in the detector, the number of electron-hole pairs are generated as follows:

$n = E/w,$ where w is the material-dependent mean energy required to produce an electron-hole pair. This energy sensitivity is unique for high-speed semiconductor X-ray detectors. In theory, advantages of direct-conversion detectors include high efficiency, high sensitivity, compact size, high spatial resolution, and energy sensitivity, as compared to indirect-conversion detectors.

Semiconductors suitable for X-ray detectors include, for example, silicon (Si), germanium (Ge), selenide (Se), cadmium telluride (CdTe), $Cd_{1-x}Zn_xTe$, and mercury telluride (HgTe). Each material has different efficiency in X-ray cross-section. In the case of non-resonant interaction where X-ray energy is far from inner shell transitions (fluorescent lines), the cross-section for photoelectric effect may be approximated by $$\sigma \propto \frac{Z^{4-5}}{E^3},$$

where Z is the atomic number of the material, and E is X-ray photon energy. In general, heavy atoms have stronger X-ray cross section than lighter atoms, for example: HgTe (Z=80, 52)>CdTe (Z=48,52)>Se (Z=34)>Ge (Z=32)>Si (Z=14) in terms of X-ray cross section. Nonetheless, having stronger X-ray cross section does not necessarily imply HgTe is superior to Si for X-ray detection, and instead each semiconductor material has its own advantages and disadvantages.

In general, using a high cross section material can reduce the size of the detector, leading to high spatial resolution and potentially fast time response as a result of small parasite capacitance. The overall performance (e.g., detectivity) of the detector is affected by the noise level caused mainly by dark currents and the time response. For example, while HgTe has high absorption coefficient and charge mobilities, HgTe suffers from small band gap and demanding fabrication process. The high dark current due to a small bandgap makes HgTe-based detectors more suitable for cryogenic temperature applications. Although silicon has the least cross section for X-ray absorption among the above-described semiconductors, the lowest dark current due to reasonably large indirect bandgap, high carrier mobility, outstanding crystal quality, and mature device fabrication techniques make silicon suitable for X-ray detection applications, for example, soft X-ray direct detection applications. Direct-conversion semiconductor detectors for high energy radiation like X-ray may have various structures, for example, a PIN diode structure (e.g., silicon:lithium detectors), a charge-coupled device (CCD), and drift detectors.

SUMMARY OF INVENTION

In general, the present disclosure provides a direct-conversion X-ray detection method and a detector structure that can realize energy-resolved detection and imaging with high efficiency and spatial resolution.

One aspect of the present disclosure provides an apparatus for electromagnetic irradiation imaging. The apparatus includes one or more pixels, each pixel including a plurality of detector cells arranged in a row extending in a row direction. The row is configured to receive photons at an incident surface at one end of the row, and the received photons penetrate the plurality of detector cells in the row direction. The plurality of detector cells of the same row are configured to generate respective signals that collectively indicate an energy-resolved spectral profile of the photons based on the penetration of the photons into the row of detector cells.

Another aspect of the present disclosure provides a method for electromagnetic irradiation imaging. The method receives photons at one or more pixels, each pixel including a plurality of detector cells arranged in a row extending in a row direction. The method receives the photons at an incident surface at one end of the row, and the photons penetrate the plurality of detector cells in the row direction. The method further generates respective signals at the plurality of detectors cells, the respective signals collectively indicating an energy-resolved spectral profile of the photons based on the penetration of the photons into the row of detector cells.

Another aspect of the present disclosure provides an apparatus for electromagnetic irradiation imaging. The apparatus includes a plurality of detector cells arranged in a row extending in a row direction. The plurality of detector cells are configured to receive photons at an incident surface at one end of the row, and the received photons penetrate the plurality of detector cells in the row direction. The apparatus further include means for generating respective signals at the plurality of detector cells. The signals collectively indicate an energy-resolved spectral profile of the photons based on the penetration of the photons into the row of detector cells.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. While aspects and embodiments are described in this application by illustration to some examples, those skilled in the art will understand that additional implementations and use cases may come about in many different arrangements and scenarios.

Aspects of the present disclosure provide a direct-conversion X-ray detection method and a detector structure that can realize energy-resolved detection and imaging with high efficiency and spatial resolution. The working principle is based on the strong energy-dependent absorption of X-ray in solids (e.g., semiconductor materials). In this disclosure, the term "X-ray" is generally used in a generic sense to denote photons of high energies typically above 100 eV. Depending on the energy, X-ray photons have significantly different absorption cross section and penetration depth in certain materials. In some aspects of the disclosure, an array of one or more rows of semiconductor cells are configured to measure the X-ray intensity when the photons propagate in a direction along the same direction of the rows. In some aspects of the disclosure, the X-ray detection method can obtain an energy-resolved X-ray spectral profile using a Laplacian transform technique. The disclosed X-ray detector structure can be implemented using a wide range of semiconductor detectors, for example, silicon CMOS/CCD detectors and compound drift detectors. The disclosed X-ray detector structure and method enable fast and economical energy-resolved X-ray imaging.

Pixel Structure of X-Ray Detector

Figure 1:
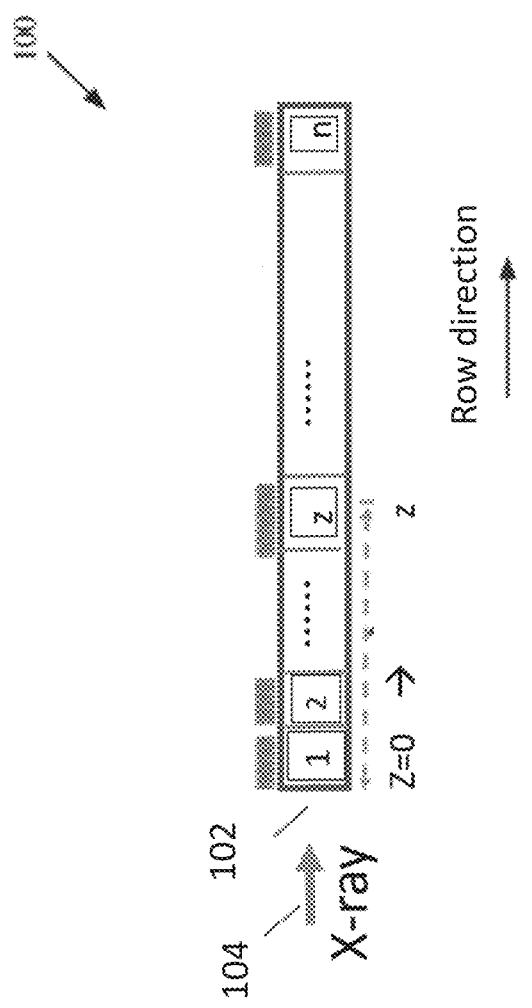
FIG. 1 is a diagram conceptually illustrating an exemplary X-ray detector structure according to one aspect of the present disclosure.

FIG. 1 is a diagram conceptually illustrating an exemplary X-ray detector structure 100 according to one aspect of the present disclosure. The detector 100 includes a row of detector cells (denoted as cell 1 to cell n in FIG. 1) that can be used to generate the signals for one energy-resolved image pixel. The signals indicate the energy-resolved spectral profile of photons detected by the pixel. In some examples, the detector cells may be fabricated on a common substrate. Z denotes the distance of the cell from the front surface 102 of the detector (pixel). X-ray photons 104 incident on the front surface 102 travel along the row of detector cells and vanish by energy transfer along the cells. The incident angle of the X-ray photons at one end of the row is substantially normal to the front surface 102 of the detector. In some aspects of the disclosure, the detector cells may be complementary metal-oxide-semiconductor (CMOS) or charge-coupled device (CCD) image sensor cells configured to detect photons (e.g., X-ray photons) or the like. However, the present disclosure is limited to using CMOS and CCD sensor cells. In some aspects, other suitable detectors may be used as the detector cells to detect X-ray photons as configured in FIG. 1. In some aspects of the disclosure, the above-described detector structure 100 may be used in a flat panel of CCD or CMOS detector cells of silicon, germanium, CdTe, CdZTe, etc.

Figure 2:
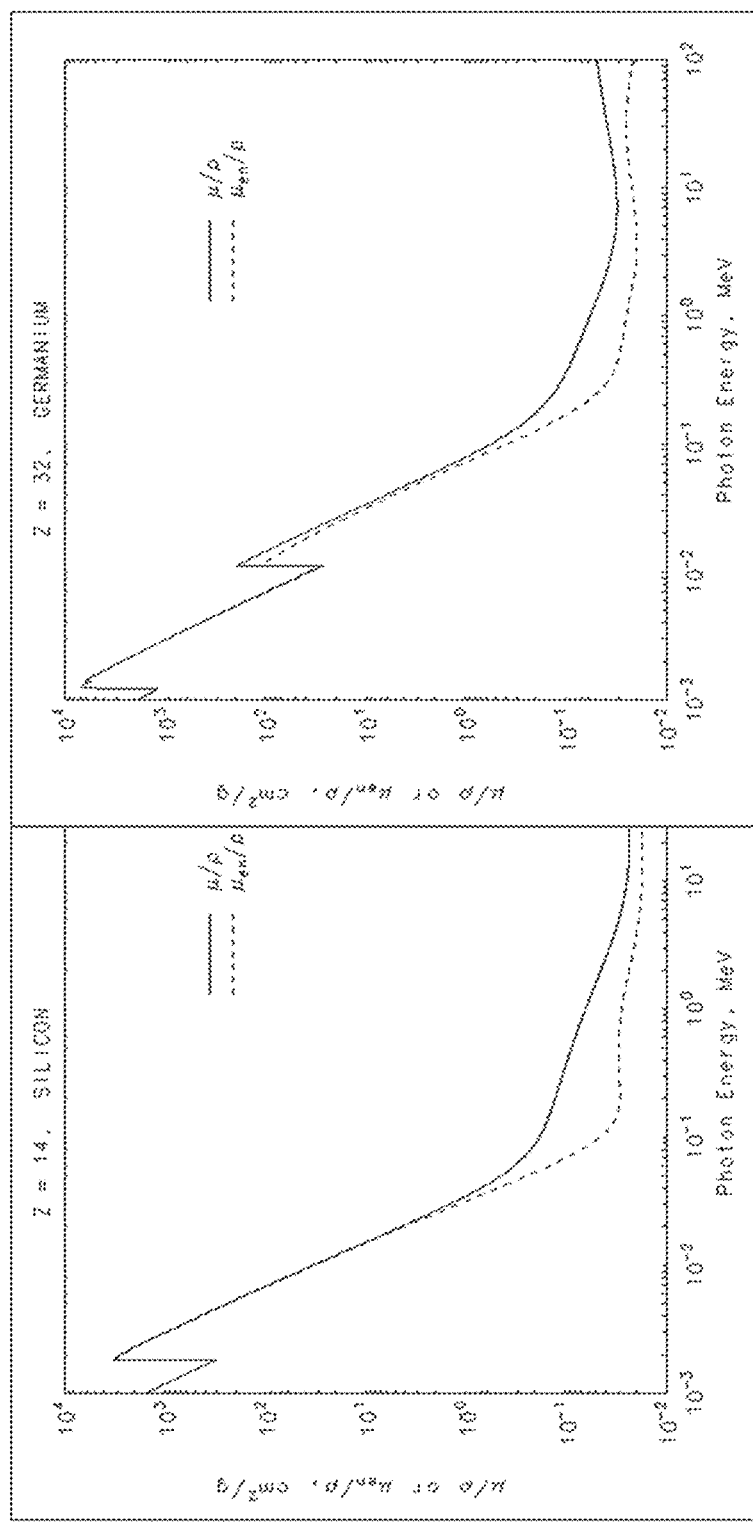
FIG. 2 shows two charts that illustrate energy-dependent photon absorption in silicon and germanium.

FIG. 2 shows two charts that illustrate strong energy-dependent photon absorption in silicon and germanium. These charts illustrate the values (y-axis) of mass attenuation coefficient ($\mu/\rho$) and mass energy-absorption coefficient ($\mu_{en}/\rho$) as a function of photon energy (x-axis) of silicon (Z=14) and germanium (Z=32). The photoelectric effect, which dominates the X-ray photon absorption in the range of 100 eV to 200 KeV, shows a strong energy dependence:

cross section $$\sigma \propto \frac{Z^{4-5}}{E^3},$$

where Z is the atomic number of the material and E is X-ray photon energy. In some aspects of the disclosure, the incident X-ray photon energy can be determined based on a penetration depth profile of the photons using the detector structure 100 shown in FIG. 1.

Algorithm for Detecting X-Ray Energy

Referring to FIG. 1, the detector structure 100 consists of a row of semiconductor detector cells (e.g., cell 1 to cell n). The detector cells are oriented such that the X-ray photons incident angle is substantially normal to the front surface 102 of the detector structure 100 such that the X-ray photons pass through along the cells substantially parallel to the row direction. A suitable electric field (denoted as E-field in FIG. 1) is applied across the cells in a direction substantially perpendicular to the row direction. Each detector cell generates an electric signal (e.g., electric charge or current) that is substantially proportional to the X-ray photon intensity, for example, according to equation (1) below.

$$I(z) = \int_0^\infty \rho(\lambda)(e^{-\alpha(\lambda)(Z-\Delta Z)} - e^{-\alpha(\lambda)Z})d\lambda = \Sigma I(\lambda)\alpha(\lambda) * e^{-\alpha(\lambda)Z}\Delta Z \quad (1)$$

Referring to equation (1), z is the distance of a cell from the detector front surface 102; I(z) is the electric signal of a cell at position z; $\rho(\lambda)$ is the spectral density of X-ray at wavelength $\lambda$; $I(\lambda)$ is the X-ray intensity reaching the detector front surface (i.e., Z=0) at the wavelength $\lambda$ within a certain window ($\lambda-\delta$, $\lambda+\delta$); $\alpha(\lambda)$ is the absorption coefficient of X-ray at wavelength $\lambda$; and $\Delta Z$ is the detector cell width. The direction of the cell width may be independent of the row direction.

Depending on the pixel size and energy resolution requirements, the number of cells contained in a row may be equal to the desired number of X-ray energy windows. More cells in a row provide higher energy resolution as a detector. For example, if the total number of cells in a row is n, the energy resolution then is determined by the ratio of X-ray energy range to n windows. For instance, if an X-ray beam has energy ranging from 10 KeV to 100 KeV, the energy resolution of a 512-cell detector is (100 KeV–10 KeV)/512 that is about 176 eV.

Below is a linear equation set (2) derived from equation (1) for a detector with n cells:

$$\begin{pmatrix} I(1) \\ I(2) \\ I(3) \\ \cdots \\ I(n) \end{pmatrix} = \begin{bmatrix} \alpha_0 \Delta Z e^{-\alpha_0 * z_0} & \alpha_1 \Delta Z e^{-\alpha_1 * z_0} & & \alpha_n \Delta Z e^{-\alpha_{n-1} * z_0} \\ \alpha_0 \Delta Z e^{-\alpha_0 * z_1} & \alpha_1 \Delta Z e^{-\alpha_1 * z_1} & \cdots & \alpha_n \Delta Z e^{-\alpha_{n-1} * z_1} \\ \vdots & & \ddots & \vdots \\ \alpha_0 \Delta Z e^{-\alpha_0 * Z_{n-1}} & \alpha_1 \Delta Z e^{-\alpha_1 * Z_{n-1}} & & \alpha_n \Delta Z e^{-\alpha_{n-1} * Z_{n-1}} \end{bmatrix} \begin{pmatrix} I(\lambda_0) \\ I(\lambda_1) \\ I(\lambda_2) \\ \cdots \\ I(\lambda_n) \end{pmatrix}$$

Here, I(1), I(2), . . . I(n) denote the electric signals generated by detector cell 1, 2, . . . n, respectively; $\Delta Z$ denotes the cell spatial width; and $Z_n$, denotes the space between the detector front surface and the n-th cells. Therefore, the X-ray photon intensity $I(\lambda)$ at specific energy range around $\lambda$ can be analytically obtained by linear equation set (3) below.

$$\begin{pmatrix} I(\lambda_0) \\ I(\lambda_1) \\ I(\lambda_2) \\ \cdots \\ I(\lambda_n) \end{pmatrix} =$$

$$\begin{bmatrix} \alpha_0 \Delta Z e^{-\alpha_0 * z_0} & \alpha_1 \Delta Z e^{-\alpha_1 * z_0} & & \alpha_n \Delta Z e^{-\alpha_{n-1} * z_0} \\ \alpha_0 \Delta Z e^{-\alpha_0 * z_1} & \alpha_1 \Delta Z e^{-\alpha_1 * z_1} & \cdots & \alpha_n \Delta Z e^{-\alpha_{n-1} * z_1} \\ \vdots & & \ddots & \vdots \\ \alpha_0 \Delta Z e^{-\alpha_0 * Z_{n-1}} & \alpha_1 \Delta Z e^{-\alpha_1 * Z_{n-1}} & & \alpha_n \Delta Z e^{-\alpha_{n-1} * Z_{n-1}} \end{bmatrix}^{-1} \begin{pmatrix} I(1) \\ I(2) \\ \cdots \\ \cdots \\ I(n) \end{pmatrix}$$

The detector structure 100 facilitates the use of small cell size for fast time response while providing sufficient X-ray absorption by a row of cells that are stacked in a direction parallel to the incident X-ray. For example, when X-ray photons pass through a stack of cells of a few centimeters in total length, the total X-ray absorption up to 100 keV may be achieved even with silicon detector cells. Stacking the cells in the X-ray penetration direction can solve the absorption efficiency problem of using small cells. Moreover, using smaller individual cells, the need for high purity crystals for cell fabrication may be avoided.

1D X-Ray Detector

Figure 3:
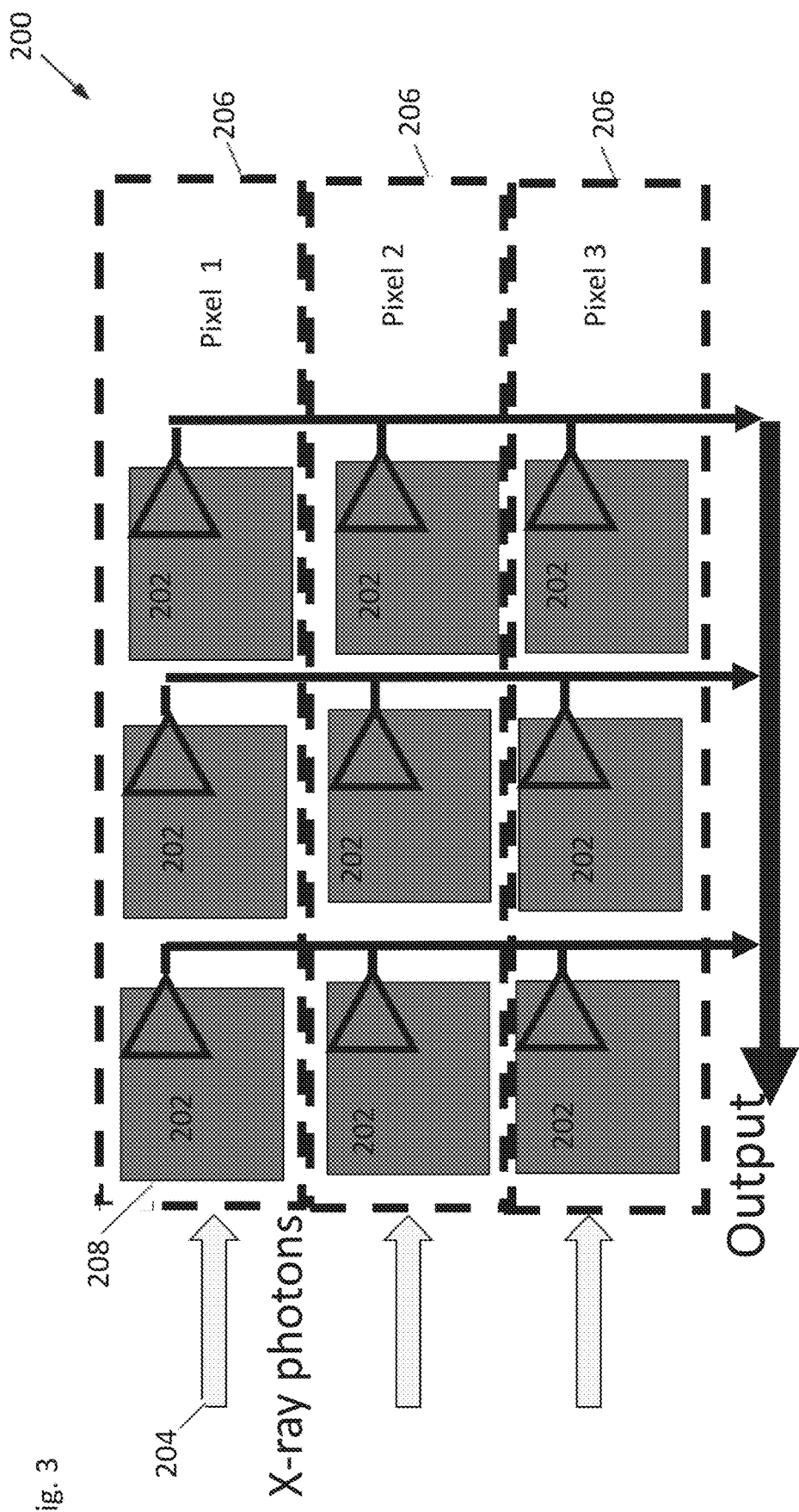
FIG. 3 is a diagram conceptually illustrating a one-dimensional X-ray detector structure according to one aspect of the present disclosure.

FIG. 3 is a diagram conceptually illustrating a one-dimensional (1D) X-ray detector structure 200 according to one aspect of the present disclosure. The 1D detector structure 200 consists of an array of detector cells 202. Three exemplary rows 206 of detector cells (denoted as pixel 1, pixel 2, and pixel 3 in FIG. 3) are shown in FIG. 3. In other examples, the X-ray detector structure 200 may have more or less rows of detector cells than those shown in FIG. 3. In some examples, each row may have two or more detector cells. In some aspects, the detector cells 202 may be CMOS or CCD cells or the like configured to detect photons (e.g., X-ray photons or the like). In one example, each row of the detector cells may have a structure similar to the detector structure 100 described above in relation to FIG. 1. In another example, the detector cells 202 in each pixel are arranged in a single row and situated immediately adjacent to each other in a row direction (i.e. without substrate, wire or sensor or any non-photoelectric layer in between the two adjacent detector cells 202). Each row of detector cells provides a pixel for X-ray imaging with energy resolution. In FIG. 3, three pixels (i.e., pixel 1, pixel 2, pixel 3) are shown. To that end, each detector cell 202 is configured to output a signal (e.g., electric signal) corresponding to the detected intensity of irradiation (e.g., denoted as X-ray photons 204 in FIG. 3) incident on the detector surface 208 and the penetration depth of the photons. As described above, different wavelengths of photons have different absorption cross section and penetration depth from the incident surface. By detecting the electric signals at the different detector cell locations along the row direction, the X-ray intensity $I(\lambda)$ at a specific energy range around wavelength $\lambda$ may be determined using the linear equation set (3) above.

In one embodiment, a CCD or CMOS image sensor is used to detect X-ray photons. The image sensor is orientated in a way that one of its sides faces towards the X-ray photons source such that the incident angle of X-ray photons at the side of the image sensor is substantially normal to the side surface across the thickness of the image sensor (i.e., the front surface and the back surface of the image sensor is substantially parallel to the traveling direction of X-ray photons).

2D X-Ray Detector

Figure 4:
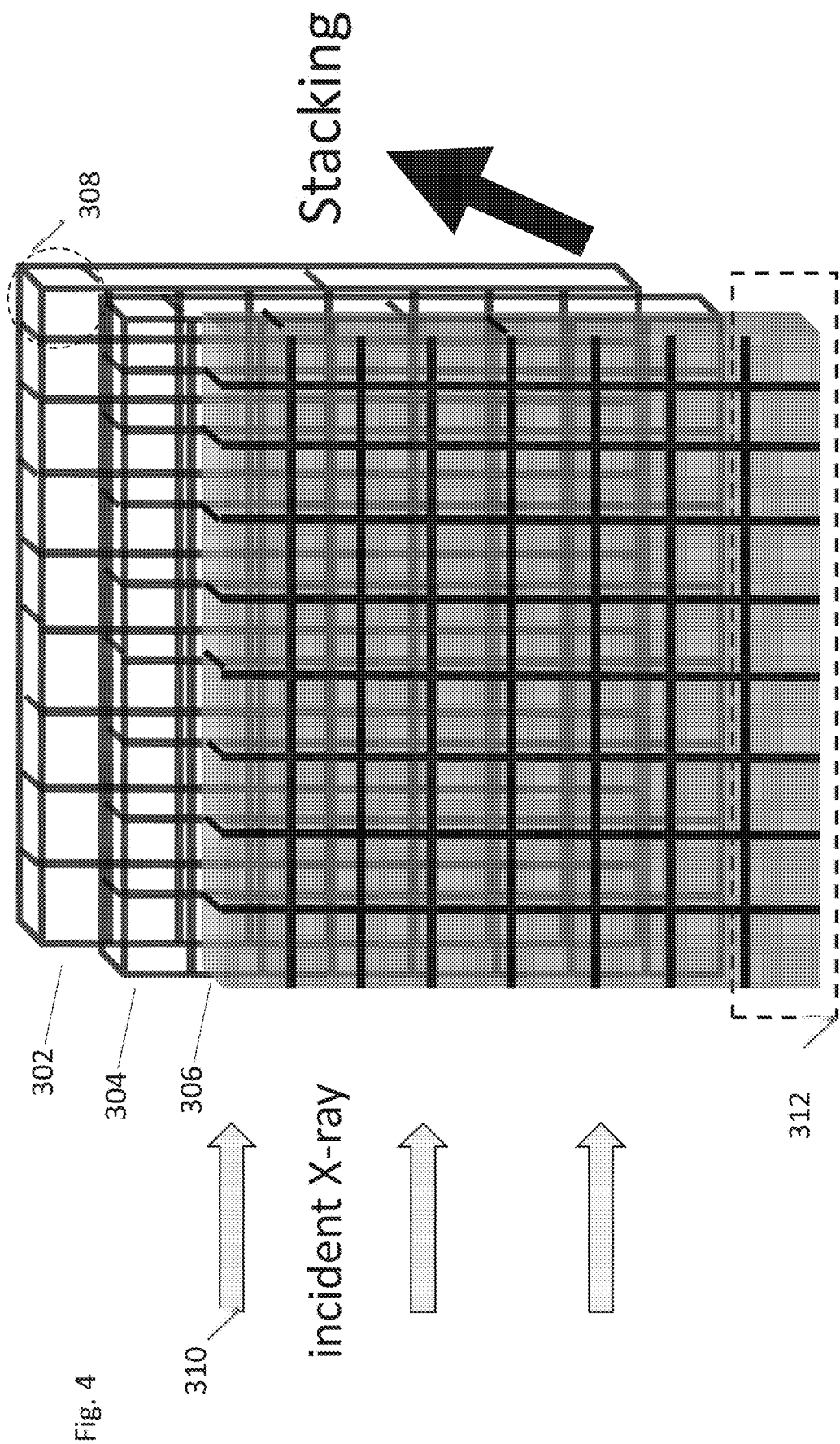
FIG. 4 is a diagram conceptually illustrating a two-dimensional X-ray detector structure according to one aspect of the present disclosure.

FIG. 4 is a diagram conceptually illustrating a two-dimensional (2D) detector structure 300 according to one aspect of the present disclosure. The 2D detector structure 300 consists of a plurality of detector layers. Three exemplary detector layers 302, 304, and 306 are shown in FIG. 4. Each detector layer has an array of detector cells similar to those described in relation to FIGS. 1 and 3 and the example as described in 1D X-Ray Detector. In some examples, the detector cells 308 may be CMOS or CCD or the like cells configured to detect irradiation photons 310 (e.g., X-ray photons) incident on the front surface of the detector structure 300. A 2D X-ray energy-resolved detector for imaging may be realized by stacking multiple 1D detector layers (e.g., detector layers 302, 304, 306) together as shown in FIG. 4. Each row (e.g., row 312) of detector cells provides one pixel for X-ray imaging with energy resolution. In FIG. 4, 3×8 pixels are illustrated in this example.

In one embodiment, a plurality of CCD or CMOS image sensors are stacked together along their front or back surfaces to form a stacked sensing structure for the detection of X-ray photons or the like. The stacked sensing structure is orientated in a way that one of its sides faces towards the X-ray photons source such that the incident angle of X-ray photons at the side is substantially normal to the side surface across the thickness of the stacked sensing structure (i.e., the front surface and the back surface of the stacked sensing structure is substantially parallel to the traveling direction of X-ray photons).

Simulation Data

Figure 5:
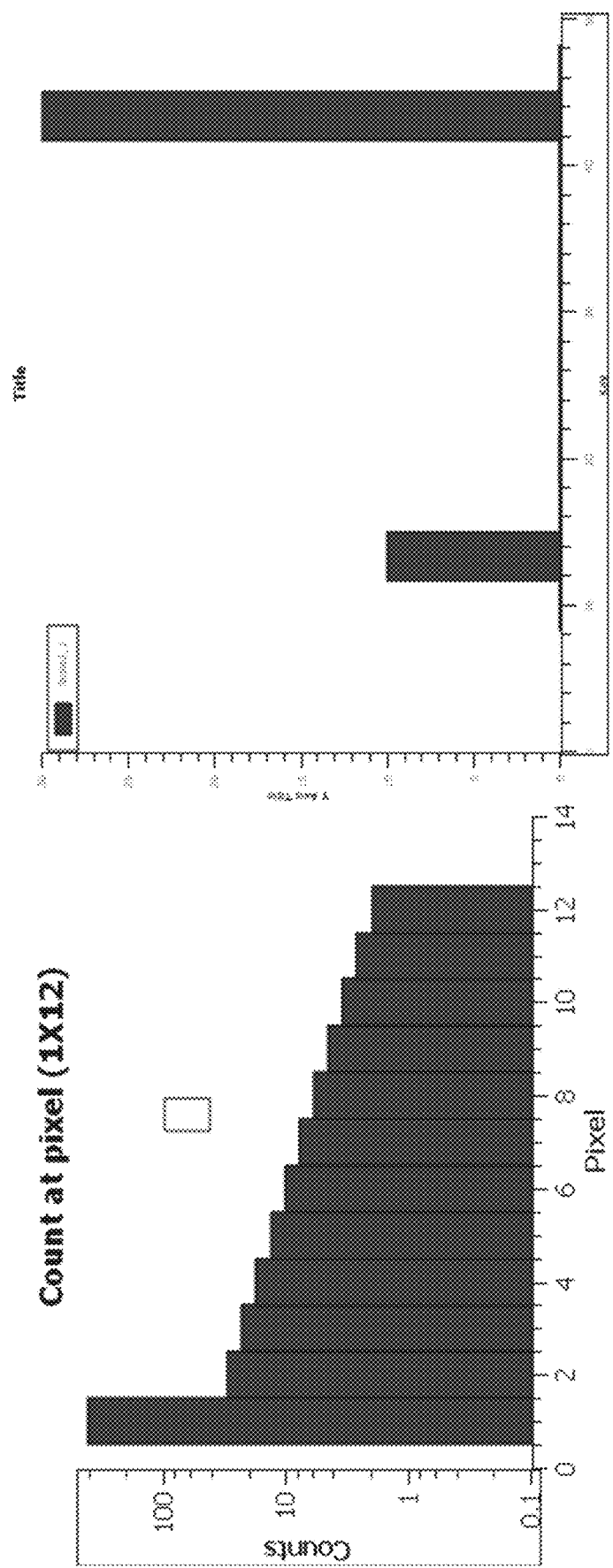
FIG. 5 is a drawing illustrating a first simulation result of X-ray detection according to one aspect of the present disclosure.

FIG. 5 is a drawing illustrating a simulation result of a conceptual X-ray detector with 12×12 pixels according to one aspect of the present disclosure. In some examples, the X-ray detector may have a structure similar to the detector structure 100 shown in FIG. 1 or detector structure 300 shown in FIG. 4. The simulation is based on an X-ray profile consisting of 13 keV photons at 25% and 43 keV photons at 75%. According to the absorption coefficient of silicon, the counts at individual pixels are shown in the left chart of FIG. 5. The right chart shows the detected beam profile corresponding to 13 keV photons at 25% and 43 keV photons at 75%.

Figure 6:
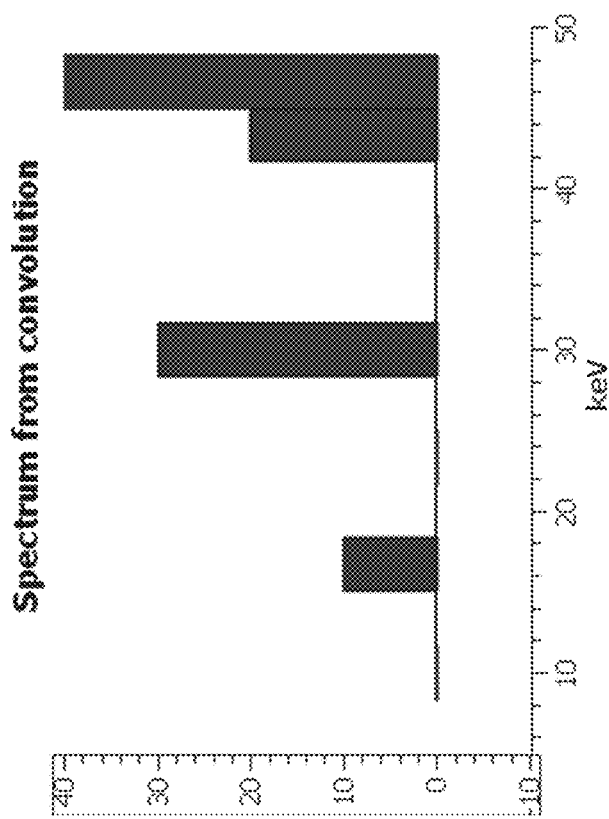
FIG. 6 is a drawing illustrating a second simulation result of X-ray detection according to one aspect of the present disclosure.
Figure 6:
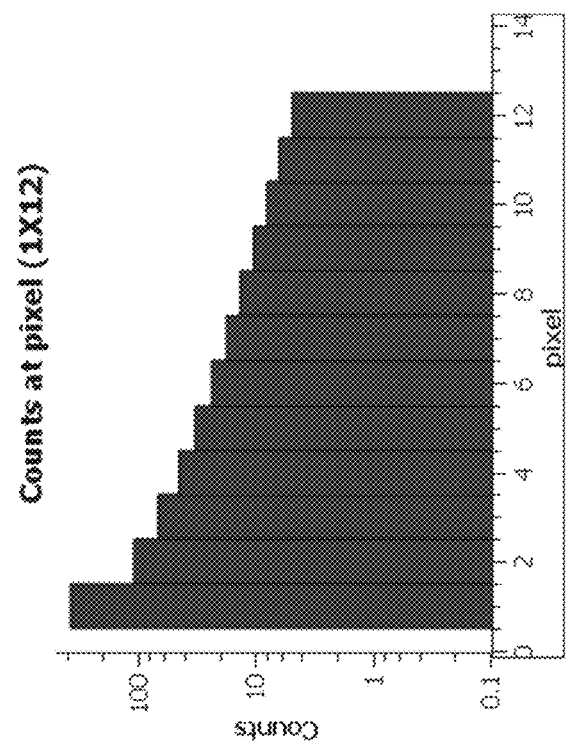

FIG. 6 is a drawing illustrating a simulation result of a conceptual X-ray detector with 12×12 pixels according to one aspect of the present disclosure. The X-ray detector may have a structure similar to the detector structure 100 shown in FIG. 1 or detector structure 300 shown in FIG. 4. The simulation is based on an X-ray profile consisting of 17 keV photons at 10%, 30 keV photos at 30%, 43 keV photons at 20%, and 47 keV photons at 40%. According to the absorption coefficient of silicon, the counts at individual pixels are shown in the left chart of FIG. 6. The right chart shows the detected beam profile corresponding to 17 keV photos at 10%, 30 keV photos at 30%, 43 keV photons at 20% and 47 keV photons at 40%.

Figure 7:
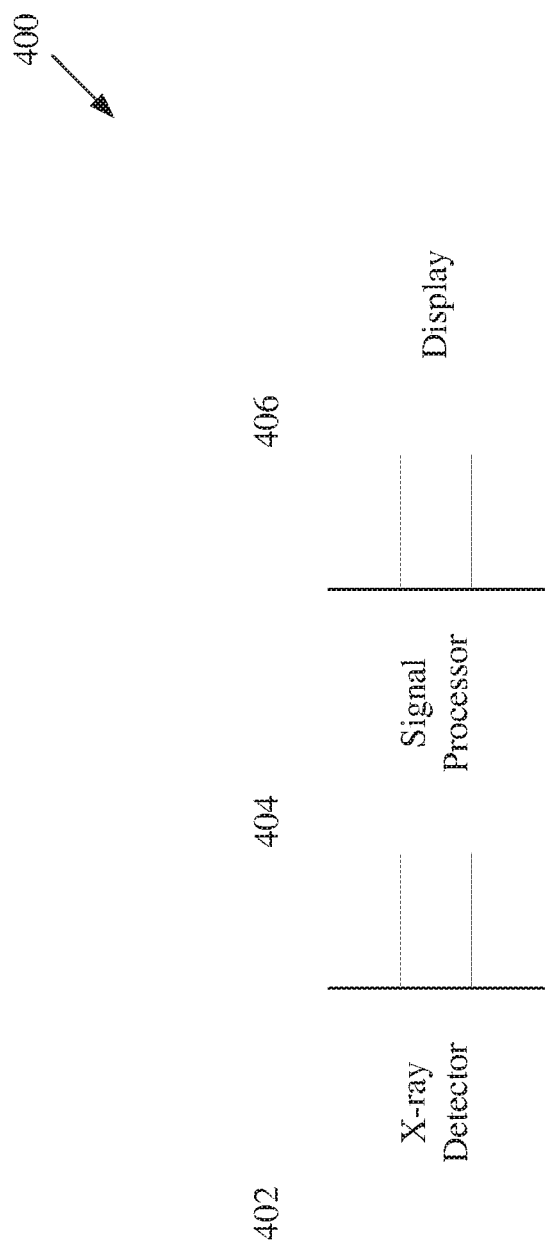
FIG. 7 is a drawing illustrating an energy-resolved X-ray imaging system according to one aspect of the present disclosure.

FIG. 7 is a drawing illustrating an energy-resolved X-ray imaging system 400 according to one aspect of the present disclosure. The system includes an X-ray detector 402, a signal processor 404, and a display 406. The X-ray detector 402 may have a structure similar to the detector structure 300 described above in relation to FIG. 4. The X-ray detector 402 may have a plural of pixels each configured to detect X-ray irradiation and corresponding photons energy at various wavelengths. A pixel of the X-ray detector 402 may have a structure similar to the X-ray detector structure 100 described above in relation to FIG. 1. For example, each pixel of the X-ray detector 402 may include a single row of detector cells stacked in a direction that is aligned with the incident angle of the X-ray irradiation. During detection of X-ray, the X-ray detector 402 is positioned such that incident photons travel through the detector cells in the row direction of the detector cells. When the photons travel through the detector cells in a row, photons with different photon intensities can penetrate the row at various distances. Because photons with higher energy can penetrate deeper into a row of detector cells than photons with lower energy, the row of detector cells can facilitate energy-resolved imaging based on the penetration of the photons. The X-ray detector 402 can also be one of the embodiments described hereinabove. In one embodiment, a moving mechanism may be connected to the X-ray detector 402 for moving the X-ray detector 402 across the X-ray photons source.

The signal processor 404 receives the electric signals generated by the detector cells in response to detection of X-ray photons. The signal processor 404 may include any type of processing devices, such as a microprocessor, a microcontroller, an embedded controller, a logic circuit, software, firmware, or the like, for processing the signals received from the X-ray detector 402. In some aspects of the disclosure, the signal processor 404 may be configured to determine the X-ray photon intensities at various energy range around different wavelengths utilizing the linear equation set (3) described above and output corresponding energy-resolved imaging signals to the display 406. Then, based on the imaging signals, the display 406 may display or output an image with energy resolution of the detected X-ray based on the photon intensities determined by the signal processor 404.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-7 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-7 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. An apparatus for electromagnetic irradiation imaging, comprising:
   one or more pixels, each pixel comprising a plurality of detector cells arranged in a row extending in a row direction, wherein the plurality of detector cells comprise charge-coupled device (CCD) sensors that are configured to generate a signal proportional to detected energy of the photons;
   wherein the row is configured to receive photons at an incident surface at one end of the row, the received photons penetrating the plurality of detector cells in the row direction; and
   wherein the plurality of detector cells of the same row are configured to generate respective signals that collectively indicate an energy-resolved spectral profile of the photons based on the penetration of the photons into the row of detector cells.

2. The apparatus of claim 1, wherein an energy resolution of the energy-resolved spectral profile is based on a number of detector cells included in the same row.

3. The apparatus of claim 1, further comprising a processor configured to convert the respective signals to the energy-resolved spectral profile based on a linear equation set of the respective signals and intensities of the photons at different wavelengths.

4. The apparatus of claim 1, wherein each of the plurality of detector cells is configured to generate the corresponding signal based on a distance of the detector cell from the incident surface, a spectral profile of the photons, an intensity of the photons, and a size of the detector cell.

5. The apparatus of claim 1, wherein the plurality of detector cells of the same row are fabricated on a same substrate.

6. The apparatus of claim 5, wherein the plurality of detector cells of the same row are stacked in a direction substantially normal to the incident surface.

7. The apparatus of claim 1, wherein each of the plurality of detector cells comprises a semiconductor material selected from the group consisting of silicon, germanium, selenide, cadmium telluride, cadmium zinc telluride, and mercury telluride.

8. The apparatus of claim 1, wherein the apparatus is a direct-conversion detector.

9. A method for electromagnetic irradiation imaging, comprising:
   receiving photons at one or more pixels, each pixel comprising a plurality of detector cells arranged in a row extending in a row direction, the photons received at an incident surface at one end of the row and penetrating the plurality of detector cells in the row direction, wherein the plurality of detector cells comprise charge-coupled device (CCD) sensors configured to generate a signal proportional to detected energy of the photons; and
   generating respective signals at the plurality of detector cells, the respective signals collectively indicating an energy-resolved spectral profile of the photons based on the penetration of the photons into the row of detector cells.

10. The method of claim 9, wherein an energy resolution of the energy-resolved spectral profile is based on a number of detector cells included in the same row.

11. The method of claim 9, further comprising:
    converting the respective signals to the energy-resolved spectral profile based on a linear equation set of the respective signals and intensities of the photons at different wavelengths.

12. The method of claim 9, wherein the generating respective signals comprises:
    generating each of the respective signals based on a distance of the corresponding detector cell from the incident surface, a spectral profile of the photons, an intensity of the photons, and a size of the detector cell.

13. The method of claim 9, wherein the receiving photons comprises:
    positioning the plurality of detector cells of the same row stacked in a direction substantially normal to the incident surface.

14. The method of claim 9, wherein the generating respective signals comprises:
    generating the respective signals proportional to energy of the photons detected at different distances from the incident surface.

15. An apparatus for electromagnetic irradiation imaging, comprising:
    a plurality of detector cells arranged in a row extending in a row direction, configured to receive photons at an incident surface at one end of the row, the received photons penetrating the plurality of detector cells in the row direction, wherein the plurality of detector cells comprise charge-coupled device (CCD) sensors that are configured to generate a signal proportional to detected energy of the photons; and
    means for generating respective signals at the plurality of detector cells, the signals collectively indicating an energy-resolved spectral profile of the photons based on the penetration of the photons into the row of detector cells.

16. The apparatus of claim 15, wherein an energy resolution of the energy-resolved spectral profile is based on a number of detector cells included in the same row.

17. The apparatus of claim 15, further comprising:
means for converting the respective signals to the energy-resolved spectral profile based on a linear equation set of the respective signals and intensities of the photons at different wavelengths.

18. The apparatus of claim 15, wherein the means for generating respective signals is further configured to:
generate each of the respective signals based on a distance of the corresponding detector cell from the incident surface, a spectral profile of the photons, an intensity of the photons, and a size of the detector cell.

19. The apparatus of claim 15, wherein the plurality of detector cells of the same row are stacked in a direction substantially normal to the incident surface.

20. The apparatus of claim 15, wherein the means for generating respective signals is further configured to:
generate the respective signals proportional to energy of the photons detected at different distances from the incident surface.

* * * * *